United States Patent
Quinn et al.

[11] Patent Number: 5,706,176
[45] Date of Patent: Jan. 6, 1998

[54] BUTTED CHIP ARRAY WITH BEVELED CHIPS

[75] Inventors: Kraig A. Quinn; Brian T. Ormond, both of Webster, N.Y.

[73] Assignee: Xerox Corporation, Stamford, Conn.

[21] Appl. No.: 693,779

[22] Filed: Jul. 22, 1996

[51] Int. Cl.⁶ .................................................. H05K 7/02
[52] U.S. Cl. .................................................. 361/760
[58] Field of Search .................. 29/739, 740, 832; 257/619, 622, 594, 620, 618, 623, 700, 782, 783, 905, 910, 911, 918, 443; 437/51, 205, 53, 249, 208, 209; 361/760, 779, 782, 783, 807, 809; 346/139 R; 347/37

[56] References Cited

U.S. PATENT DOCUMENTS

| | | | |
|---|---|---|---|
| 4,467,342 | 8/1984 | Tower | 257/443 |
| 4,990,462 | 2/1991 | Sliwa, Jr. | 437/51 |
| 5,473,513 | 12/1995 | Quinn | 361/760 |
| 5,510,273 | 4/1996 | Quinn | 437/3 |
| 5,545,913 | 8/1996 | Quinn et al. | 257/443 |

Primary Examiner—Donald Sparks
Attorney, Agent, or Firm—R. Hutter

[57] ABSTRACT

In an array of butted silicon chips, as would be found in a full-page photosensitive scanner, ink-jet printhead, or LED exposure bar, individual silicon chips forming the array each define a planar bevel near the border of a neighboring chip. The planarity of the bevel avoids damage to the chips when the chips are placed in the chip array assembly.

9 Claims, 2 Drawing Sheets

BUTTED CHIP ARRAY WITH BEVELED CHIPS

The present invention is directed to an imaging device, such as a photosensitive scanner or an ink-jet printhead, in which a plurality of silicon chips are arranged in a linear array.

U.S. Pat. No. 5,473,513, assigned to the assignee hereof, discloses a scanner in which a plurality of semiconductor chips are mounted in a line on a substrate. In the case of a hard-copy scanner, each of the chips in the line is typically provided with an array of pixel-size photosensors, which can record signals based on light reflected from a hard-copy image moving past the photosensors. An arrangement of silicon chips on a substrate can also be used for creating a full-page-width array of LEDs, as would be used in electrophotographic printing apparatus, or else ink-jet ejectors, with all or at least portions of each ejector being formed in each silicon chip.

The repetitive structures, such as pixel-sixed photosensors, on each silicon chip require that the individual silicon chips be precisely positioned and spaced relative to each other on the substrate so as to create a suitably "seamless" single linear array of repetitive structures that could be used, for example, in a full-page width hard-copy scanner or ink-jet printhead. It therefore follows that a critical area for such arrays is the space between adjacent structures on neighboring silicon chips. There is a need to provide chips with photosites or other structures extending to the border or edge of the chip, to assure continuity when the chips are assembled into a full-width array. In such an area, neighboring chips can directly contact each other, or can have predetermined uniform amounts of spacing therebetween. U.S. Pat. No. 5,510,273, for example, shows one technique for creating uniform spacing of adjacent chips in such an array, by applying the chip to a substrate which is urged evenly against a work surface defining a concave bow.

In the particular embodiment of a scanning array such as shown in U.S. Pat. No. 5,473,513, each individual chip defines "back-cuts" which extend on each chip from a surface immediately adjacent the substrate to a surface immediately adjacent a neighboring chip. A typical useful function of such a back-cut is to provide a space for liquid adhesive to spread to when the chips are initially tacked onto the substrate. In the '513 patent, these back-cuts form curved surfaces. However, use of such curved back-cuts as shown in the patent create the difficulty of accidentally damaging the chip when tacking on the chip in an automated process. Sometimes, if the chip being placed within a line of chips is not properly placed, an edge of a chip near the back-cut can catch on another chip, and one or both chips can be damaged when pressure is applied to tack down a chip.

According to the present invention, there is provided a chip array comprising a substrate defining a main surface, A plurality of silicon chips are attached to the main surface, and arranged in a linear array on the main surface. Each pair of adjacent silicon chips in the linear array define a border therebetween. A silicon chip of a plurality of silicon chips defines a bevel extending from a portion of the chip adjacent the main surface to a portion of the chip adjacent a border with another chip in the linear array. This bevel defines a planar surface.

Figure 1:
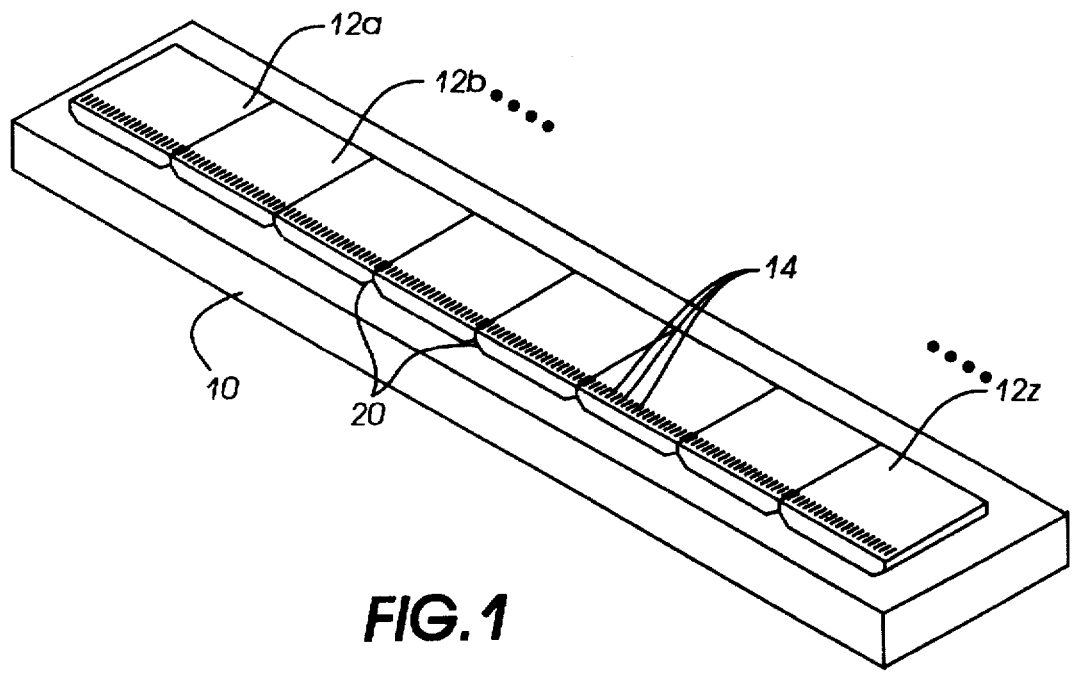
FIG. 1 is a perspective view showing the essential elements of a chip array assembly according to the present invention.

FIG. 1 is a perspective view of a typical array of silicon chips arranged on a substrate. As used in the claims herein the phrase "silicon chips" can be expanded to encompass any chip largely comprising a typical semiconductor material, although using present technology this would almost always be silicon. On a mounting substrate 10 are disposed a plurality of substantially similar silicon chips 12a–12z, arranged in a line as shown. Each individual silicon chip 12 may include any number of electronic or micromechanical structures, such as ink-jet ejectors or portions thereof, photosensors, or LEDs as would be found in an exposure device for an electrophotographic digital printer. As used in the claims herein, all of the these structures are referred to as "repetitive structures" because a large number of such photosensors, ejectors, or LEDs are disposed, typically in a line, on each chip. When a large number of chips such as 12a–12z are installed on a substrate 10, the repetitive structures 14 on each individual chip together combine with repetitive structures on other chips to create a single large linear array of repetitive structures 14, as shown.

According to the present invention, each individual silicon chip 12 defines at least one bevel, indicated as 20. The bevels on each chip are disposed at the borders between neighboring chips along the line of silicon chips in the finished array. Whereas, in the '513 patent, these back-cuts 20 define curved surfaces, according to the present invention, each bevel 20 defines a planar surface which extends from the main surface of substrate 10 to an area immediately adjacent a border with a neighboring chip in the array, as shown.

Figure 2:
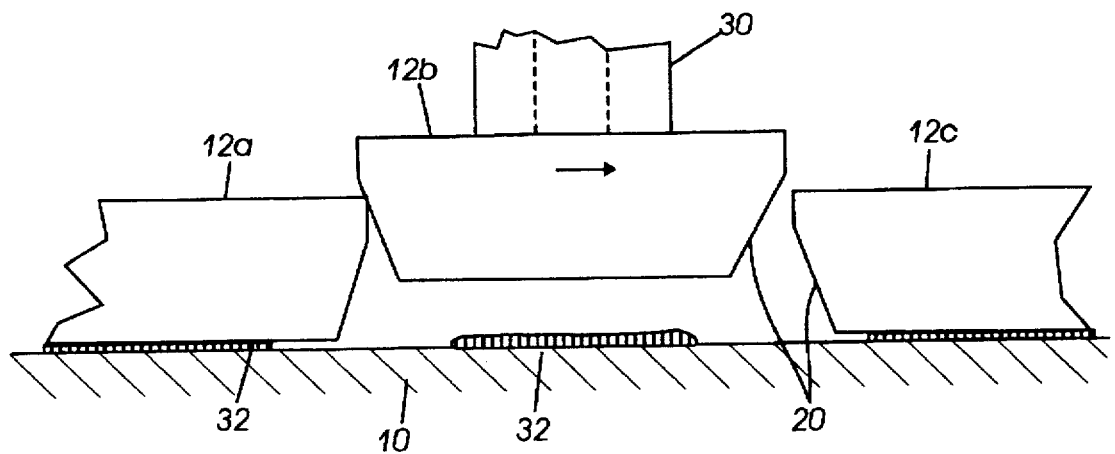
FIG. 2 is an elevational view showing a portion of the chip assembly shown in FIG. 1, at a stage in manufacture when one particular chip is being placed between two chips which are already attached to a substrate.

FIG. 2 is an elevational view of a portion of the assembly shown in FIG. 1, at a point in manufacture when an individual chip, such as 12b, is placed between two adjacent chips 12a, 12c on the main surface of substrate 10. It is a fairly common practice in the manufacture of butted-chip arrays, that one particular chip within a line will be found, after testing, to be unsuitable and require replacement. It is therefore fairly common to have to place a chip precisely between two chips which have already been permanently attached to the substrate 10.

In a typical operation of placing a chip such as 12b on the substrate 10, the chip 12b is held by a vacuum collet, here indicated as 30, which is then used to place the chip 12b at the desired precise location on the main surface of substrate 10. The surface of vacuum collet 30 is typically made of polished stainless steel, and the vacuum pressure within the collet 30 can typically be adjusted as needed; relatively low pressures will allow the chip held thereon to slide freely on the end of the collet. Placement of chip 12b with vacuum collet 30 can be performed either by hand or with some sort of robot arm. In either case, it is common that the replacement chip 12b being moved toward the assembly will not at first be precisely placed for exact perpendicular motion toward the main surface of substrate 10. Even with a robotic system, the chip 12b being placed may approach the assembly at a slight angle or with a slight error in position, so that one edge of chip 12b, such as the left edge as shown in FIG.

2, may accidentally come into contact with a neighboring chip such as 12a.

With the curved back-cuts of the prior art, it has been found that such an accidental touching as shown in FIG. 2 could damage one or both chips. With the bevel of the present invention, however, in which the surfaces 20 are planar, a corner of a neighboring chip such as 12a can be used to guide the movement of the vacuum collet 30, and thereby precisely place chip 12b into its appropriate position. A temporary reduction in vacuum level on collet 30 during the operation allows the chip 12b to slide freely at the end of the collet while it is being placed between chips 12a and 12c. The chip 12b being replaced is caused to adhere to the main surface of substrate 10 by a droplet of wet adhesive such as shown as 32. Excess wet adhesive 32 can spread to the inter-chip spaces created by the bevels of adjacent chips.

According to a preferred embodiment of the present invention, the angle of the planar surface of bevel 20 should be not less than 45 degrees and not more than 75 degrees, and most preferably approximately 60 degrees, as shown, relative to a main surface of substrate 10 adjacent the substrate.

Figure 3:
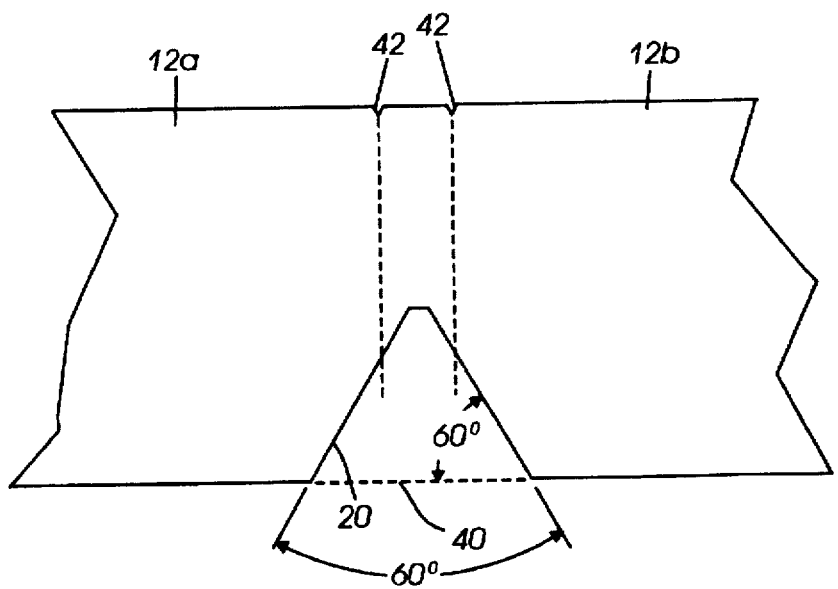
FIG. 3 is a sectional elevational view through a portion of a wafer from which chips to be used in the chip array assembly are diced.

FIG. 3 is an elevational view of portions of two silicon chips, such as 12a and 12b, at a time before they are attached to substrate 10, when the respective chips are diced from a single silicon wafer, as is common in the art. (It is not, of course, necessary that chips which are adjacent in the original wafer be adjacent in the finished assembly.) In order to create the desired flat bevels 20 for each chip such as 12a and 12b, a preferred technique is to use a rotating saw blade which itself defines tapered edges corresponding to the profile shown in FIG. 3. Here, the area which is cut out of the wafer, the border of which is indicated as 40, corresponds to a tapered shape of a rotating blade which, in the view of FIG. 3, would be moving out of the page. As can be seen, the profile of the blade has a desirable triangular, or alternately trapezoidal, shape. Further apparent in the view of FIG. 3 is the fact that the thin end of the triangular profile is disposed between two etched V-grooves which have been previously placed on the opposite side of the wafer forming chips 12a and 12b. As can be seen in FIG. 3, the trenches formed by these V-grooves 42 are slightly outside the top corners of the trapezoid formed by cut 40. When the chip is subsequently sawn through the bottoms of the V-grooves 42, as shown by the dotted lines in FIG. 3, it will be apparent that the portion of each chip 12a, 12b remaining will have a neat, planar bevel 20 formed therein.

In a preferred dicing technique for separating the chips from a wafer, two passes of a saw blade are used, one pass to form the side surface of each chip. The saw blade (not shown) is preferably smaller in width, but larger than one-half the width, than the width between V-grooves 42.

Further according to this embodiment of the invention, the finished chips, such as 12a, 12b include the planar bevel 20 extending no less one quarter of the thickness nor no more than three-quarters of the thickness, or preferably approximately one-half the thickness of each chip, the thickness being defined as the distance between the surface of the chip immediately adjacent the main surface of substrate 10, and the opposite surface thereof.

In one preferred embodiment of the present invention, the wafer from which chips 12a and 12b are formed is about 635 micrometers in thickness; and the distance between the centers of the V-grooves 42 is about 127 micrometers. A blade with a trianagular profile, as shown, makes a cut which extends into the wafer for one-half the thickness of the wafer. The blade makes a cut which defines a total angle of approximately 60 degrees, which, as shown, results in the desirable angle of 60 degrees between the planar bevel 20 and the main surface of the wafer.

Figure 4A:
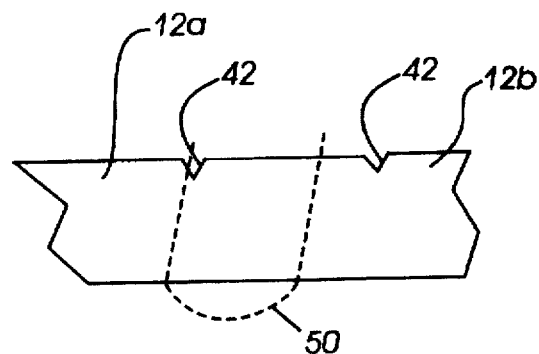
FIGS. 4A and 4B are sectional elevational views through a portion of a wafer from which chips to be used in the chip array assembly are diced, according to two respective steps of a dicing technique.
Figure 4B:
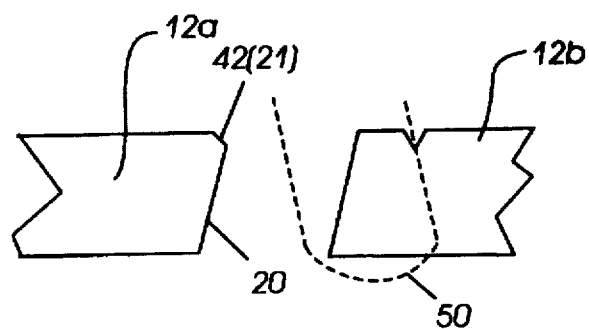

FIGS. 4A and 4B are sectional elevational views from a portion of a wafer from which two chips such as 12a and 12b may be diced, in a technique alternate to that shown in FIG. 3. In the two steps respectively shown in FIGS. 4A and 4B, a tiltable dicing blade illustrated as 50 makes two successive cuts between the chip areas corresponding to chips 12a and 12b. In FIG. 4A, the blade 50 is disposed at a diagonal angle relative to the main surface of the wafer, while in the second cut, shown in FIG. 4B, the blade 50 is disposed a similar but opposite angle relative to the chip. It will further be noted that the two cuts made by blade 50 both pass through a V-groove 42, which were described with regard to FIG. 3.

As shown in FIG. 4B, the combination of the V-groove 42 and the cut made by blade 50 creates a distinct double-bevel when the chip is cut in this manner, so that there are no surfaces on the side edge of the chip such as 12a which are perpendicular to the main surface of the chip 12a. A chip made in the technique illustrated in FIGS. 4A and 4B will thus define, in addition to the planar bevel 20, a top bevel here indicated as 21, which is formed from a surface of the V-groove 42. This top bevel 21 extends from the top surface of the chip 12a (that is, a surface opposite the substrate in the finished array) to a portion of the chip 20a adjacent a border with another chip in the finished linear array. This top bevel 21 further defines a planar surface. The top bevel 21 can intersect with bevel 20, as shown on the left-hand side of FIG. 4B, leaving no non-bevelled surface on the side of chip 12a; or alternately bevel 20 need not meet top bevel 21, thereby leaving a surface (not shown) on the side of the chip between top bevel 21 and bevel 20.

While the invention has been described with reference to the structure disclosed, it is not confined to the details set forth, but is intended to cover such modifications or changes as may come within the scope of the following claims.

We claim:

1. A chip array, comprising:
   a substrate defining a main surface; and
   a plurality of silicon chips attached to the main surface and arranged in a linear array on the main surface, each pair of adjacent silicon chips in the linear array defining a border therebetween;
   a silicon chip of the plurality of silicon chips defining a bevel extending from a portion of the chip adjacent the main surface to a portion of the chip adjacent a border with another chip in the linear array, the bevel defining a planar surface.

2. The array of claim 1, the silicon chip defining a thickness from the main surface of the substrate to a surface of the chip opposite the substrate, the bevel extending no less than one-quarter but no more than three-quarters of the thickness of the silicon chip.

3. The array of claim 2, the bevel extending about one-half the thickness of the silicon chip.

4. The array of claim 1, the planar surface defined by the bevel defining an angle of not less than 45 degrees and not more than 75 degrees relative to the main surface of the substrate.

5. The array of claim 4, the planar surface defined by the bevel defining an angle of approximately 60 degrees relative to the main surface of the substrate.

6. The array of claim 1, the silicon chip defining a first bevel adjacent a first border with a first neighboring chip in the linear array and a second bevel adjacent a second border with a second neighboring chip in the linear array.

7. The array of claim 1, a silicon chip of the plurality of silicon chips defining a top bevel extending from a portion of the chip opposite the main surface of the substrate to a portion of the chip adjacent a border with another chip in the linear array, the bevel defining a planar surface.

8. The array of claim 7, the top bevel on a silicon chip of the plurality of silicon chips intersecting with the bevel on said silicon chip.

9. The array of claim 1, each silicon chip in the plurality of silicon chips defining repetitive structures thereon, the repetitive structures on the plurality of silicon chips together forming a single linear array.

* * * * *